US009293346B2

(12) United States Patent
Takaba et al.

(10) Patent No.: US 9,293,346 B2
(45) Date of Patent: Mar. 22, 2016

(54) METHOD FOR ETCHING ORGANIC FILM AND PLASMA ETCHING DEVICE

(71) Applicant: TOKYO ELECTRON LIMITED, Tokyo (JP)

(72) Inventors: Hiroyuki Takaba, Miyagi (JP); Hironori Matsuoka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/385,820

(22) PCT Filed: Mar. 26, 2013

(86) PCT No.: PCT/JP2013/058844
§ 371 (c)(1),
(2) Date: Sep. 17, 2014

(87) PCT Pub. No.: WO2013/157359
PCT Pub. Date: Oct. 24, 2013

(65) Prior Publication Data
US 2015/0064924 A1    Mar. 5, 2015

(30) Foreign Application Priority Data

Apr. 17, 2012 (JP) .................... 2012-094048

(51) Int. Cl.
*H01L 21/306* (2006.01)
*H01L 21/311* (2006.01)
(Continued)

(52) U.S. Cl.
CPC ....... *H01L 21/31138* (2013.01); *H01J 37/3222* (2013.01); *H01J 37/32192* (2013.01); *H01J 37/32449* (2013.01); *H01J 37/32816* (2013.01); *H01L 21/0276* (2013.01); *H01L 21/67069* (2013.01); *H01J 2237/327* (2013.01); *H01J 2237/334* (2013.01)

(58) Field of Classification Search
CPC .................... H01J 2237/334; H01J 37/32192; H01J 9/00
USPC ....................... 438/703, 710, 717; 156/345.35
See application file for complete search history.

(56) References Cited

U.S. PATENT DOCUMENTS

2005/0048787 A1* 3/2005 Negishi et al. ................ 438/706
2005/0070111 A1   3/2005 Kushibiki et al.
(Continued)

FOREIGN PATENT DOCUMENTS

JP   2005-129893 A   5/2005
JP   2009-152586 A   7/2009
(Continued)

OTHER PUBLICATIONS

International Search Report mailed Jun. 18, 2013 in PCT/JP2013/058844.

*Primary Examiner* — Duy Deo
*Assistant Examiner* — Maki Angadi
(74) *Attorney, Agent, or Firm* — Rothwell, Figg, Ernst & Manbeck, P.C.

(57) ABSTRACT

In a method for etching an organic film according to an embodiment, a target object that has an organic film is set in a processing chamber. Then, a processing gas containing COS gas and $O_2$ gas is supplied to the processing chamber and a microwave for plasma excitation is supplied to the inside of the processing chamber to etch the organic film.

11 Claims, 10 Drawing Sheets

(51) Int. Cl.
*H01L 21/027* (2006.01)
*H01J 37/32* (2006.01)
*H01L 21/67* (2006.01)

(56) References Cited

U.S. PATENT DOCUMENTS

2009/0163028 A1  6/2009  Jung
2010/0108264 A1* 5/2010  Delgadino et al. ....... 156/345.35
2011/0039416 A1  2/2011  Cole et al.
2011/0159697 A1  6/2011  Mukawa
2012/0031875 A1  2/2012  Hosoya et al.

FOREIGN PATENT DOCUMENTS

| JP | 2010-109373 A | 5/2010 |
| JP | 2011-40757 A | 2/2011 |
| JP | 2011-134896 A | 7/2011 |
| JP | 2012-33833 A | 2/2012 |

* cited by examiner

METHOD FOR ETCHING ORGANIC FILM AND PLASMA ETCHING DEVICE

CROSS REFERENCE TO RELATED APPLICATION

This application is a 35 U.S.C. 371 National Phase Entry Application from PCT/JP2013/058844, filed Mar. 26, 2013, which claims priority to Japanese Patent Application No. 2012-094048, filed Apr. 17, 2012, the disclosures of which are incorporated herein in their entirety by reference.

FIELD OF THE INVENTION

The present invention relates to an etching method and a plasma etching device; and, more particularly, to a method for etching an organic film and a plasma etching device that can be used for implementing the method.

BACKGROUND OF THE INVENTION

In manufacturing semiconductor devices, a mask with a desired pattern is formed on a substrate to be processed. The mask may be a multilayer mask made of a multilayer film including a resist film, a Si anti-reflection coating film, i.e., a SiARC (Anti Reflection Coating) film, and an organic film. In order to form the multilayer mask, the organic film, the SiARC film and the photosensitive resist film are formed on the substrate to be processed. Then, a resist mask is formed by exposing and developing the resist film to have a pattern. Next, the SiARC film and the organic film are etched.

As for a method for forming such a multilayer mask in a desired pattern, there is used a method for realizing pattern size accuracy by suppressing excessive etching on a sidewall of the multilayer mask by depositing by-products generated during the etching on the sidewall defining a space formed by the etching. A sidewall protection technique using by-products is disclosed in, e.g., Patent Document 1. However, the sidewall protection technique using by-products requires a complicated process or condition management in order to uniformly control the deposition amount of by-products over the entire sidewall, as disclosed in Patent Document 1.

Recently, methods using COS (carbonyl sulfide) gas as an additional gas which are disclosed in Patent Documents 2 and 3 are suggested as a sidewall protection technique during etching. Specifically, in the method disclosed in Patent Document 2, a parallel plate type plasma etching device etches a SiARC film by using a gaseous mixture of $CF_4$ gas and COS gas. Further, in the method disclosed in Patent Document 3, after a SiARC film is etched in the method of Patent Document 2, the parallel plate type plasma etching device etches an organic film by using a gaseous mixture of $O_2$ gas and COS gas.

PATENT DOCUMENTS

Patent Document 1: Japanese Patent Application Publication No. 2005-129893
Patent Document 2: Japanese Patent Application Publication No. 2011-134896
Patent Document 3: Japanese Patent Application Publication No. 2012-33833

In the methods disclosed in Patent Documents 2 and 3, COS gas is dissociated into CO and S (sulfur) by a magnetic field generated by the parallel plate type plasma etching device, and activated S reacts with etching by-products generated by RF bias sputtering to generate compounds. The generated compounds are adhered to the sidewall. In this manner, the sidewall is protected.

Hence, in the conventional method using COS gas as an additional gas, the volume of the sidewall protection film tends to be non-uniform in a depth direction of the pattern. For example, as shown in FIG. 6 of Patent Document 3, a width, i.e., a CD (critical dimension) value of the multilayer mask, is not uniform between a top portion and a bottom portion thereof. In other words, in the method for etching a multilayer mask, a vertical profile of the sidewall of the multilayer mask needs to be improved.

SUMMARY OF THE INVENTION

In view of the above, the present invention provides a method for etching an organic film which can improve a vertical profile of a sidewall and a plasma etching device that can be used for implementing the method for etching an organic film.

In accordance with an aspect of the present invention, there is provided a method for etching an organic film, including: preparing in a processing chamber a target object having an organic film; and etching the organic film by supplying a processing gas containing COS gas and $O_2$ gas into the processing chamber and supplying a microwave for plasma excitation into the processing chamber. In accordance with an embodiment, the target object has a multilayer film having a patterned resist film and the organic film formed between the resist film and the target object.

In the method which uses a microwave for plasma excitation, SO radicals are dominant as dissociation species containing S obtained by dissociation of COS gas. In the method, the SO radicals mainly contribute to the sidewall protection. In other words, in the method, unlike the conventional sidewall protection using compounds or by-products, the SO radicals absorbed on the sidewall to protect the sidewall. Therefore, in accordance with the method, the organic film can be etched while ensuring the sidewall having a highly vertical profile. Further, in the method, since the sidewall is protected by the SO radicals, ashing of the multilayer mask becomes relatively easier.

In accordance with an embodiment, in the etching the organic film, the processing gas further containing $N_2$ gas is supplied. In accordance with the present embodiment, since the $N_2$ gas is contained in the processing gas, it is possible to reduce a difference in CD values between a region where a pattern is sparsely formed (hereinafter, referred to as "sparse region") and a region where the pattern is densely formed (hereinafter, referred to as "dense region"). Further, such a difference can be further reduced by controlling a ratio of $N_2$ gas and $O_2$ gas in the processing gas.

In accordance with an embodiment, in the etching the organic film, a pressure in the processing chamber is controlled to a range from 20 mTorr to 100 mTorr. In accordance with the present embodiment, a pattern width of the multilayer mask over the target object can be controlled while reducing effect on the verticality of the sidewall by controlling the pressure in the processing chamber within the above range.

In accordance with an embodiment, the multilayer film has a Si anti-reflection coating film provided between the resist film and the organic film, and the method further includes, before the etching the organic film, etching the Si anti-reflection coating film by supplying a gas containing fluorocarbon-based gas and COS gas into the processing chamber and supplying a microwave into the processing chamber. In accordance with the present embodiment, the patterned resist film, i.e., the resist mask, can be protected during the etching of the Si anti-reflection coating film. Hence, it is possible to suppress the decrease in the thickness of the resist mask remaining after the etching of the Si anti-reflection coating film.

In accordance with another aspect of the present invention, there is provided a plasma etching device including: a processing chamber; a gas supply unit configured to supply a processing gas into the processing chamber; a microwave generating unit; and an antenna, connected to the microwave generating unit, for supplying a microwave for plasma excitation into the processing chamber, wherein the gas supply unit supplies a processing gas containing COS gas and $O_2$ gas. In an embodiment, the antenna may be a radial line slot antenna (RLSA) connected to a microwave generator through a coaxial waveguide.

The plasma etching device can etch the organic film of the multilayer film including the patterned resist film on the organic film while protecting the sidewall defining the space formed by the etching. In accordance with the plasma etching device, unlike the conventional sidewall protection using compounds or by-products, the SO radicals absorbed on the sidewall to protect the sidewall. Therefore, in accordance with the apparatus, the organic film can be etched while ensuring a sidewall having a highly vertical profile. Further, in the plasma etching device, since the sidewall is protected by the SO radicals, ashing of the multilayer mask becomes relatively easier.

In accordance with an embodiment, the gas supply unit supplies the processing gas further containing $N_2$ gas. In accordance with the present embodiment, since the $N_2$ gas is contained in the processing gas, it is possible to reduce a difference in CD values between the sparse region and the dense region. Further, in accordance with the present embodiment, the gas supply unit may include a unit configured to control a flow rate ratio of $N_2$ gas and $O_2$ gas. In accordance with the present embodiment, the difference in the CD values between the sparse region and the dense region can be further reduced by controlling a ratio of $N_2$ gas and $O_2$ gas in the processing gas.

In accordance with an embodiment, the plasma etching device further includes a pressure controller configured to control a pressure in the processing chamber. In accordance with the present embodiment, the pattern width of the multilayer mask over the entire target object can be controlled while reducing effect on the verticality of the sidewall by controlling the pressure in the processing chamber. In accordance with an embodiment, the gas supply unit supplies another processing gas containing fluorocarbon-based gas and COS gas. The apparatus of the present embodiment can further etch the Si anti-reflection coating film of the multilayer film which is provided between the organic film and the resist film. In other words, the plasma etching device of the present embodiment can etch the Si anti-reflection coating film, before the etching of the organic film, by supplying the gas containing fluorocarbon-gas and COS gas into the processing chamber and supplying the microwave into the processing chamber. In accordance with the plasma etching device of the present embodiment, the resist mask can be protected during the etching of the Si anti-reflection coating film and, thus, the decrease in the film thickness of the resist film can be reduced.

Effect of the Invention

As described above, in accordance with various aspects and embodiments of the present invention, it is possible to provide a method for etching an organic film which can form a pattern having a highly vertical profile and a plasma etching device that can be used to implement the method.

DETAILED DESCRIPTION OF THE EMBODIMENTS

Figure 1:
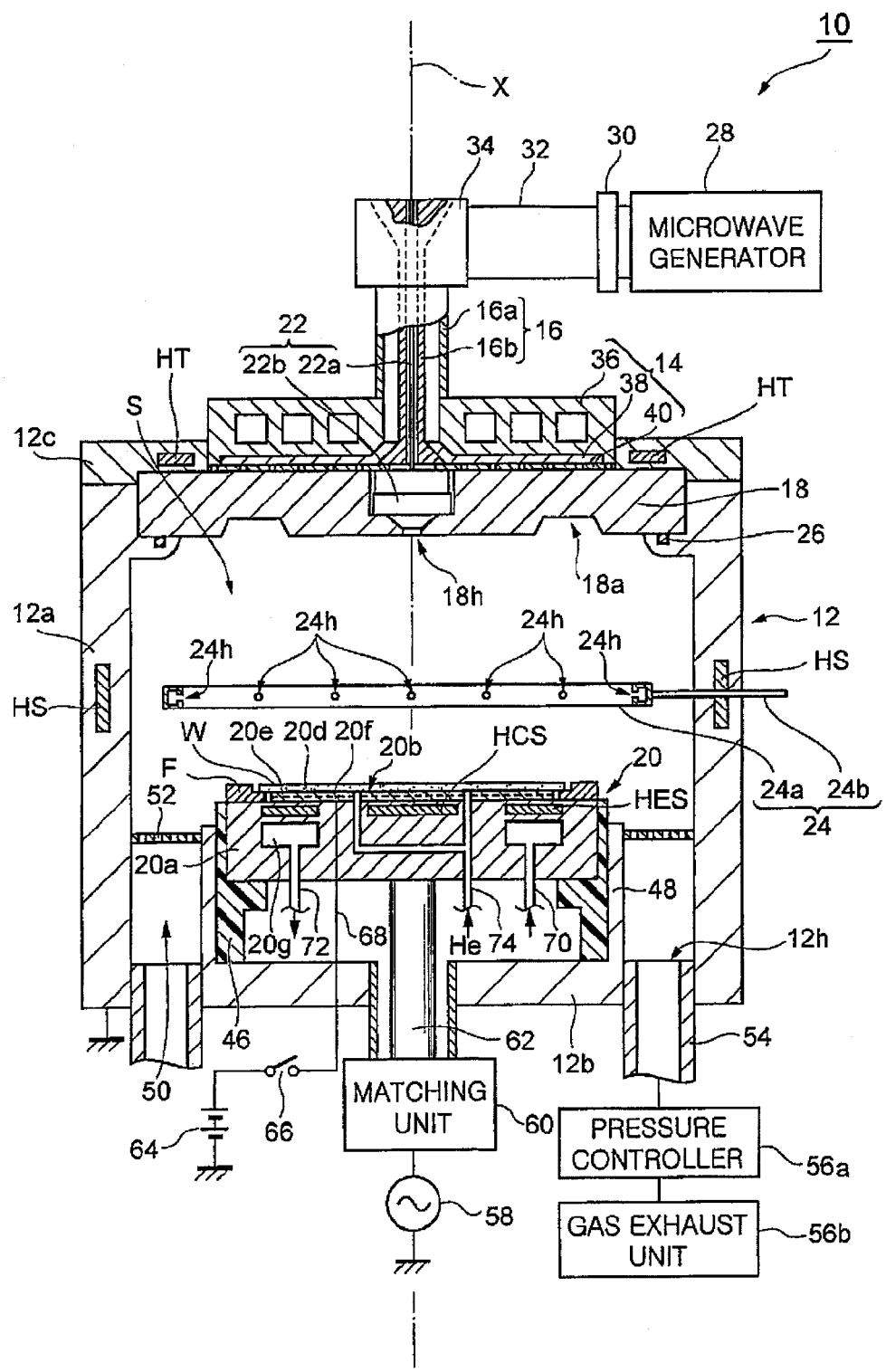
FIG. 1 is a cross sectional view schematically showing a plasma etching device in accordance with an embodiment of the present invention.

Hereinafter, embodiments of the present invention will be described with reference to the accompanying drawings. In the drawings, like reference numerals will be used for like or corresponding parts.

First, a plasma etching device that can be used for implementing an etching method in accordance with an embodiment of the present invention will be described. A plasma etching device 10 shown in FIG. 1 includes a processing chamber 12.

The processing chamber 12 defines a processing space S for accommodating a target object W. The processing chamber includes a sidewall 12a, a bottom portion 12b and a ceiling portion 12c. The sidewall 12a has a substantially cylindrical shape extending in an extension direction of an axis X (hereinafter, referred to as "axis X direction"). The bottom portion 12b is disposed at a bottom side of the sidewall 12a. A gas exhaust port 12h is formed in the bottom portion 12b. A top portion of the sidewall 12a is open. The top opening of the sidewall 12a is closed by a dielectric window 18. The dielectric window 18 is inserted between the top portion of the sidewall 12a and the ceiling portion 12c. A sealing member 26 may be provided between the top portion of the sidewall 12a and the dielectric window 18. The sealing member 26 is, e.g., an O-ring, and contributes to the sealing of the processing chamber 12.

The plasma etching device 10 further includes a stage 20 provided within the processing chamber 12. The stage 20 is provided below the dielectric window 18. In the present embodiment, the stage 20 includes a pedestal 20a and an electrostatic chuck 20b.

The holder 20a is supported by a cylindrical support 46. The cylindrical support 46 is made of an insulating material and extends vertically upward from the bottom portion 12b. Further, a conductive cylindrical supporting portion 48 is provided around an outer circumference of the cylindrical support 46. The cylindrical supporting portion 48 extends vertically upward from the bottom portion 12b of the processing chamber 12 along the outer circumference of the cylindrical support 46. An annular gas exhaust passageway 50 is formed between the cylindrical supporting portion 48 and the sidewall 12.

An annular baffle plate 52 having a plurality of through holes is attached above the gas exhaust passageway 50. The gas exhaust passageway 50 is connected to a gas exhaust line 54 that defines the gas exhaust port 12h, and the gas exhaust line 54 is connected to a gas exhaust unit 56b via a pressure controller 56a. The gas exhaust unit 56b has a vacuum pump such as a turbo molecular pump or the like. The pressure controller 56a controls a pressure in the processing chamber 12 by controlling a gas exhaust amount of the gas exhaust unit 56b. The pressure controller 56a and the gas exhaust unit 56b can decrease a pressure in the processing space S inside the processing chamber 12 to a predetermined vacuum level. By operating the gas exhaust unit 56b, the processing gas around the outer periphery of the stage 20 can be exhausted through the gas exhaust passageway 50.

The holder 20a also serves as a high frequency electrode. A high frequency power supply 58 for RF bias is electrically connected to the holder 20a via a matching unit 60 through a power feed rod 62. The high frequency power supply 58 outputs a high frequency power having a predetermined high frequency, e.g., 13.65 MHz, which is suitable for controlling energy of ions attracted to the target object W, at a predetermined power level. The matching unit 60 includes a matcher for matching an impedance of the high frequency power supply 58 side and an impedance of a load side including mainly the electrode, the plasma and the processing chamber. The matcher has a blocking capacitor for self-bias generation.

The electrostatic chuck 20b is provided on a top surface of the holder 20a. In the present embodiment, a top surface of the electrostatic chuck 20b forms a mounting region where the target object W is mounted. The electrostatic chuck 20b supports the target object W by using electrostatic attraction force. A focus ring F is provided radially outward of the electrostatic chuck 20b to annularly surround the circumference of the target object W. The electrostatic chuck 20b includes an electrode 20d and insulating films 20e and 20f. The electrode 20d is made of a conductive film and disposed between the insulating films 20e and 20f. A high voltage DC power supply 64 is electrically connected to the electrode 20d via a switch 66 through a coated wire 68. The electrostatic chuck 20b can attractive and hold thereon the target object W by using Coulomb force generated by a DC voltage applied from the DC power supply 64.

A coolant channel 20g extending annularly in a circumferential direction is provided inside the holder 20a. A coolant, e.g., cooling water, having a predetermined temperature is supplied from a chiller unit into the coolant channel 20g via pipelines 70 and 72 to be circulated. A processing temperature of the target object W on the electrostatic chuck 20b can be controlled by a temperature of the coolant. Further, a heat transfer gas, e.g., He gas, is supplied from a heat transfer gas supply unit to a gap between the top surface of the electrostatic chuck 20b and the backside of the target object W through a gas supply line 74.

In the present embodiment, the plasma etching device further includes heaters HT, HS, HCS, and HES as temperature control units. The heater HT is installed inside the ceiling portion 12c and extends annularly to surround an antenna 14. The heater HS is installed inside the sidewall 12a and extends annularly. The heater HS is installed at a position corresponding to the middle in a height direction of the processing space S (i.e., axis X direction). The heater HCS is installed inside the holder 20a. Inside the holder 20a, the heater HCS is installed below a central portion of the mounting region, i.e., a region intersecting the axis X Further, the heater HES is installed inside the holder 20a and extends annularly to surround the heater HCS. The heater HES is provided below an outer peripheral portion of the mounting region.

The plasma etching device 10 further includes the antenna 14, a coaxial cable 16, the dielectric window 18, a microwave generator 28, a tuner 30, a waveguide 32, and a mode transducer 34. The microwave generator 28 generates a microwave having a frequency of 2.45 GHz, for example. The microwave generator 28 is connected to an upper portion of the coaxial cable 16 via the tuner 30, the waveguide 32 and the mode transducer 34. The coaxial cable 16 extends along the axis X that is the central axis. The coaxial cable 16 has an outer conductor 16a and an inner conductor 16b. The outer conductor 16a has a cylindrical shape extending in the axis X direction. A lower end of the outer conductor 16a is electrically connected to an upper portion of a cooling jacket 36 having a conductive surface. The inner conductor 16b is installed inside the outer conductor 16a. The inner conductor 16b extends along the axis X. A lower end of the inner conductor 16b is connected to a slot plate 40 of the antenna 14.

In the present embodiment, the antenna 14 is disposed within an opening formed at the ceiling portion 12c. The antenna 14 has a dielectric plate 38 and the slot plate 40. The dielectric plate 38 shortens a wavelength of the microwave and has a substantially disc shape. The dielectric plate 38 is made of, e.g., quartz or alumina. The dielectric plate 38 is disposed between the slot plate and the bottom surface of the cooling jacket 36. Therefore, the antenna 14 is constituted by the dielectric plate 38, the slot plate 40 and the bottom surface of the cooling jacket 36.

The slot plate 40 is a substantially disc-shaped metal plate having a plurality of slot pairs. In the present embodiment, the antenna 14 may be a radial line slot antenna. FIG. 2 is a top view showing an example of the slot plate shown in FIG. 1. A plurality of slot pairs 40a is formed in the slot plate 40. The slot pairs 40a are spaced apart from each other at a predetermined interval in a radial direction and also spaced apart from each other at a predetermined interval in a circumferential direction. Each slot pair 40a includes two slot holes 40b and 40c. The slot holes 40b and 40c extend in directions intersecting with or orthogonal to each other.

Referring back to FIG. 1, in the plasma etching device 10, the microwave generated by the microwave generator 28 is propagated to the dielectric plate 38 through the coaxial waveguide 16 and applied to the dielectric window 18 through the slot holes of the slot plate 40.

The dielectric window 18 has a substantially disc shape and is made of, e.g., quartz or alumina. The dielectric window 18 is provided directly below the slot plate 40. The microwave from the antenna 14 transmits through the dielectric window 18 to be introduced into the processing space S. Accordingly, an electric field is generated directly below the dielectric window 18, and a plasma is generated in the processing space. In this manner, in accordance with the plasma etching device 10, the plasma can be generated by using the microwave without applying a magnetic field.

In the present embodiment, a recess 18a may be formed in a bottom surface of the dielectric window 18. The recess 18a is formed annularly around the axis X and has a tapered shape. The recess 18a is formed to promote generation of standing wave by the introduced microwave and can contribute to effective plasma generation using the microwave.

Figure 2:
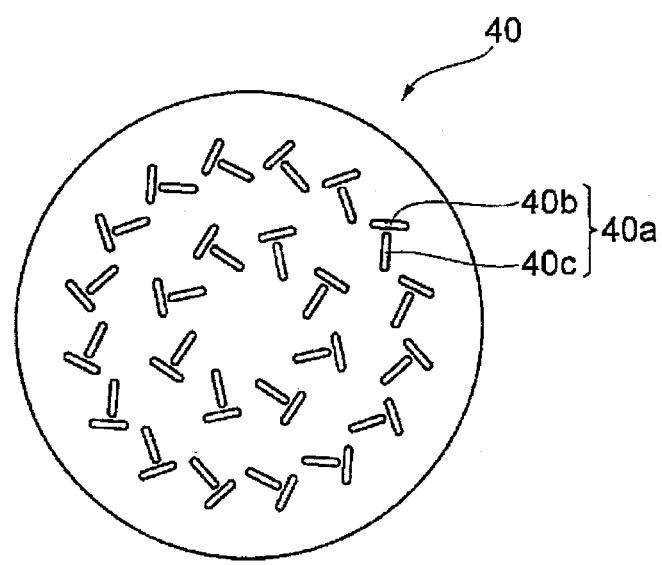
FIG. 2 is a top view of a slot plate in accordance with an embodiment of the present invention.
Figure 3:
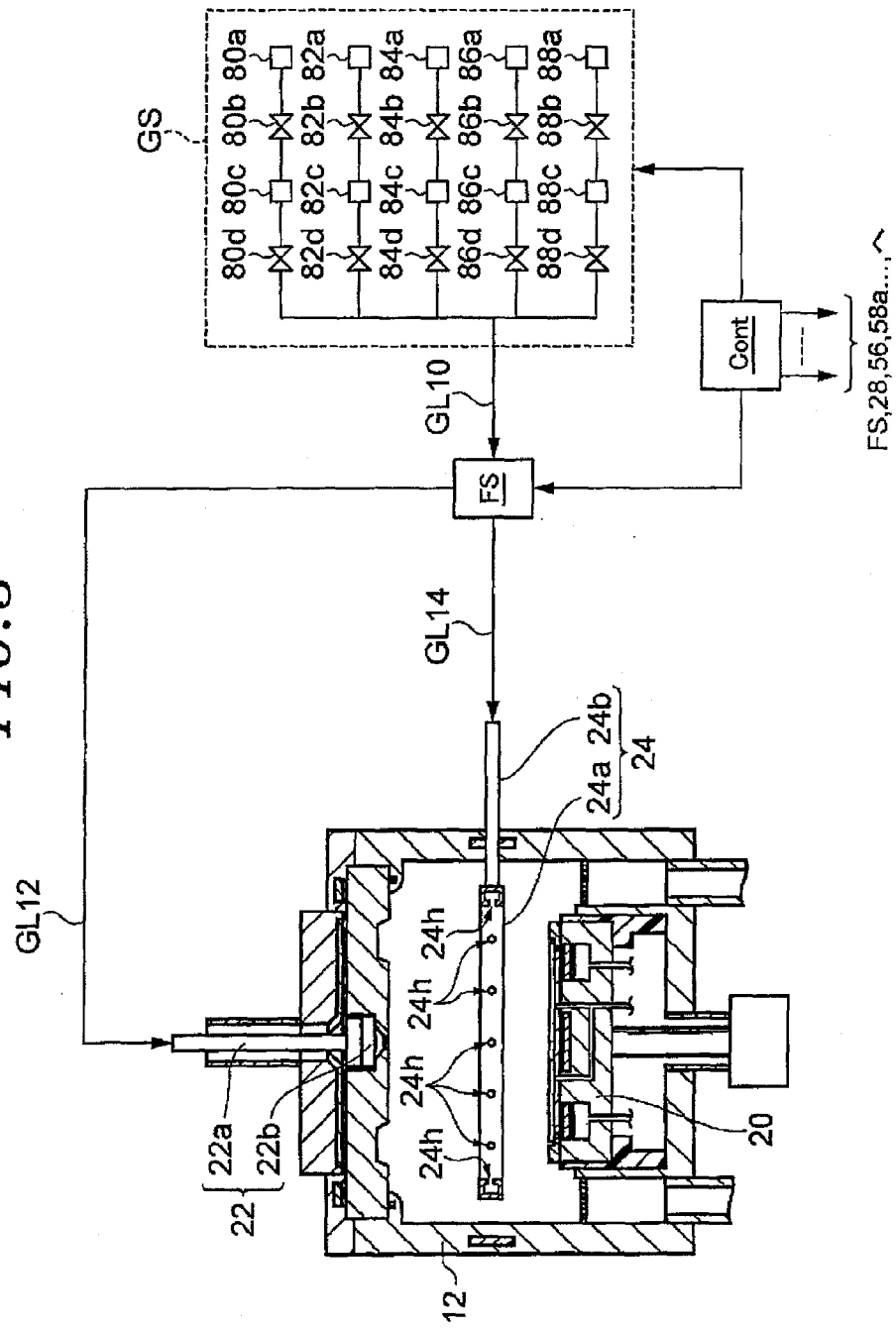
FIG. 3 schematically shows a gas supply unit of the plasma etching device in accordance with the embodiment of the present invention.

Referring to FIG. 3 together with FIG. 1, FIG. 3 schematically shows a gas supply unit in accordance with an embodiment of the present embodiment. As shown in FIGS. 1 and 3, the plasma etching device 10 includes a central introduction unit 22, a peripheral inlet portion 24, a flow splitter FS and a gas supply unit GS. In the present embodiment, these components form a unit for supplying a processing gas.

The central introduction unit 22 has a pipeline 22a and an injector 22b. The pipeline 22a passes through the inner conductor 16b and extends along the axis X. The pipeline 22a is connected to the injector 22b. The injector 22b has a plurality of through holes extending in the axis X. A space where the injector 22b is accommodated and a hole 18h that connects the space and the processing space S are formed in the dielectric window 18 along the axis X. The central introduction unit 22 allows the processing gas to be supplied from a position above the processing space S into the processing space S through the pipeline 22a, the through holes of the injector 22b and the holes 18h along the axis X.

The peripheral inlet portion 24 has an annular line 24a and a pipeline 24b. The annular line 24a is provided in the processing chamber 12 so as to extend annularly about the axis X at an intermediate position in the axis X direction of the processing space S. The annular line 24a has a plurality of gas injection holes 24h opened toward the axis X. The gas injection holes 24h are arranged annularly about the axis X. The pipeline 24b is connected to the annular line 24a and extends to the outside of the processing chamber 12. The peripheral inlet portion 24 allows the processing gas to be introduced into the processing space S toward the axis X through the pipeline 24b, the annular line 24a and the gas injection holes 24h.

The gas supply unit GS supplies the processing gas to the central introduction unit 22 and the peripheral inlet portion 24. The gas supply unit GS includes gas sources 80a, 82a, 84a and 86a. In the present embodiment, the gas sources 80a, 82a, 84a and 86a are sources of $CF_4$ gas, $O_2$ gas, COS gas and $N_2$ gas, respectively. The gas source 80a is connected to a common gas line GL10 via a valve 80b, a mass flow controller 80c and a valve 80d. The gas source 82a is connected to the common gas line GL10 via a valve 82b, a mass flow controller 82c and a valve 82d. The gas source 84a is connected to the common gas line GL10 via a valve 84b, a mass flow controller 84c and a valve 84d. The gas source 86a is connected to the common gas line GL10 via a valve 86b, a mass flow controller 86c and a valve 86d. In the present embodiment, the gas supply unit GS further includes a gas source 88a. The gas source 88a may be a gas source of $CH_2F_2$ gas and may be connected to the common gas line GL10 via a valve 88b, a mass flow controller 88c and a valve 88d.

The common gas line GL10 is connected to the flow splitter FS. The flow splitter FS distributes the processing gas supplied from the common gas supply line 10 to gas lines GL12 and GL14. The gas line GL12 is connected to the central introduction unit 22 and the gas line GL14 is connected to the peripheral inlet portion 24. Accordingly, the processing gas from the gas supply unit GS is distributed to the central introduction unit 22 and the peripheral inlet portion 24 by the flow splitter FS. Further, in the plasma etching device 10, the central introduction unit 22 and the peripheral inlet portion 24 may be connected to separate gas supply units GS. With such a configuration, a gas composition ratio and/or a flow rate ratio of the gases supplied from the central introduction unit 22 and the peripheral inlet portion 24 into the processing space S can be spatially controlled in the plasma etching device 10.

The plasma etching device 10 may further include a controller Cont as shown in FIG. 3. The controller Cont may be a programmable controller such as a computer device. The controller Cont can transmit control signals to the mass flow controllers 80c, 82c, 84c, 86c and 88c to control flow rates of gases from the gas sources 80a, 82a, 84a and 86a. Further, the controller Cont can transmit control signals to the valves 80b, 80d, 82b, 82d, 84b, 84d, 86b, 86d, 88b and 88d to control opening/closing of these valves. In addition, the controller Cont can transmit control signals to the flow splitter FS to control a ratio of the amount of the processing gas supplied to the central introduction unit 22 and the amount of the processing gas supplied to the peripheral inlet portion 24, that is, a ratio of the gas flow rate of the central introduction unit 22 and the gas flow rate of the peripheral inlet portion 24. Moreover, in the present embodiment, the controller Cont may supply control signals to the microwave generator 28, the high frequency power supply 58, and the pressure controller 56a to control power of the microwave, power and ON/OFF of the RF bias and a pressure in the processing chamber 12, respectively.

Figure 4:
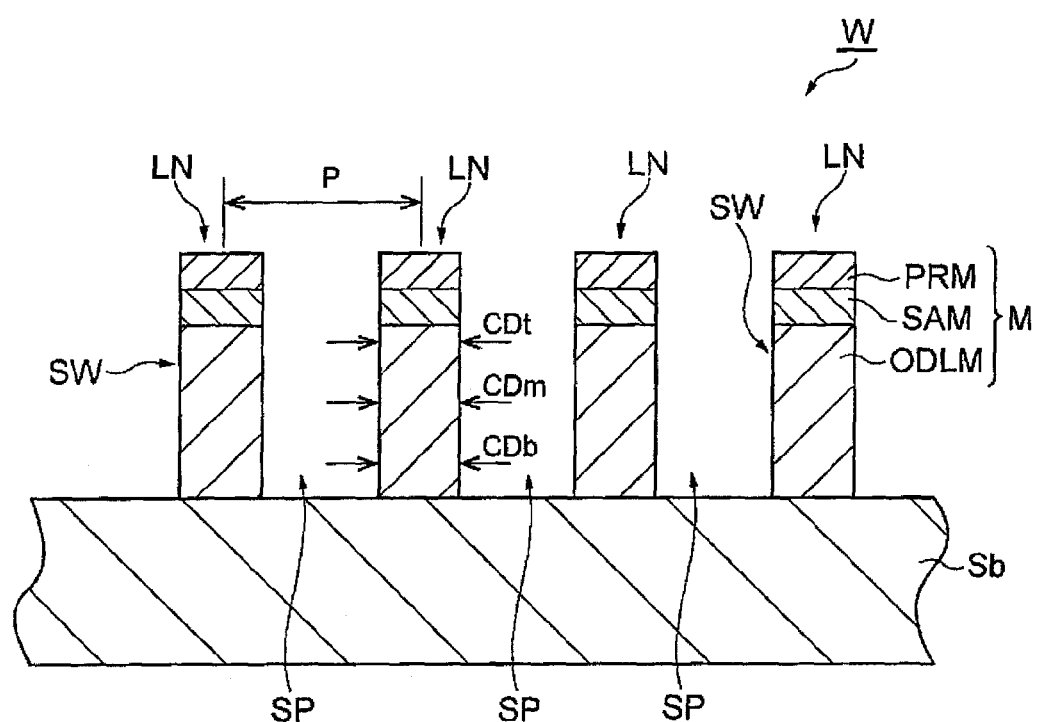
FIG. 4 is a cross sectional view showing a multilayer mask in accordance with an embodiment of the present embodiment.

In the present embodiment, the plasma etching device 10 is used for forming the multilayer mask shown in FIG. 4. As shown in FIG. 4, the multilayer mask of the present embodiment has a pattern in which a line LN and a space SP are alternately repeated (i.e., a line-and-space pattern). Further, as shown in FIG. 4, lines LN in the multilayer mask M of the present embodiment may be spaced apart from each other at a regular pitch P. The multilayer mask M may include an organic film portion ODLM formed on a substrate Sb, a SiARC film portion SAM formed on the organic film portion ODLM, and a resist mask PRM formed on the SiARC film portion SAM. The substrate Sb may include an etching target film, e.g., a semiconductor layer such as a SiN layer, to be etched by using the multilayer mask M. According to analysis using, e.g., an XPS (X-ray photoelectron spectroscopy) method, the organic film portion ODLM is made of an organic film containing amorphous carbon in which a ratio of the number of atoms of carbon to the number of atoms of oxygen (carbon atom number/oxygen atom number) is about 8 and a ratio of the number of atoms of carbon to the number of atoms of nitrogen (carbon atom number/nitrogen atom number) is about 9, and the resist mask PRM is made of a resist film that is photosensitive to, e.g., ArF laser beam. Further, the resist mask PRM may be made of a resist material that is photosensitive to g-ray, i-ray, or KrF laser beam.

In the plasma etching device 10, when the SiARC film is etched to form the SiARC film portion SAM, $CF_4$ gas and COS gas supplied respectively from the gas sources 80a and 84a are introduced as the processing gas into the processing chamber 12. In the plasma etching device 10, fluorine-based chemical species, i.e., fluorine ions or fluorine radicals, dissociated from $CF_4$ gas by the plasma excitation using a microwave mainly contribute to the etching of the SiARC film. More specifically, the plasma etching device 10 for exciting a plasma by using a microwave cannot excite COS until an electron temperature reaches a level at which COS is dissociated and thus dissociates COS into CO and S (sulfur) by reaction between COS and activated fluorine dissociated from $CF_4$, as will be described later. S radicals are dominant as dissociation species of S and thus are adsorbed on the surface of the resist mask PRM. In this manner, the resist mask PRM is modified and protected. Hence, in accordance with the plasma etching device 10, the SiARC film can be etched such that the decrease in the remaining film thickness of the resist mask PRM is reduced. In another embodiment, when the SiARC film is etched, $CH_2F_2$ gas supplied from the source gas 88a may be introduced, instead of COS gas, into the processing chamber 12.

In the plasma etching device 10, when the organic film is etched to form the organic film portion ODLM, $O_2$ gas supplied from the gas source 82a and COS gas supplied from the gas source 84a are introduced as the processing gas into the processing chamber 12. In the plasma etching device 10, gas is dissociated by the plasma excitation using a microwave, thereby generating chemical species such as oxygen ions or oxygen radicals. Such chemical species mainly contribute to the etching of the organic film.

Moreover, in the plasma etching device 10, when the organic film is etched, COS gas is dissociated into CO and SO. Hereinafter, a COS gas dissociation mechanism in a parallel plate type plasma etching device and that in the plasma etching device 10 will be described in detail. C (carbon) and S (sulfur) in COS are bonded at a bond energy of 305 KJ/mol. C (carbon) and O (oxygen) in COS are bonded at a bond energy of 619 KJ/mol. An electron temperature in the parallel plate type etching device is generally higher than 2 eV to 3 eV and has energy sufficient to disconnect the coupling between C and O in COS gas. Therefore, in the parallel plate type plasma etching device, S is dissociated from COS gas by electrons in the plasma, and reaction between activated S and etching by-products generates compounds. The compounds thus generated are adhered to the sidewall.

Meanwhile, an electron temperature in the plasma etching device 10 using a microwave for plasma excitation is 1 eV to 2 eV. The electron temperature is smaller than 2 eV and does not have energy sufficient to disconnect the bond in COS gas. However, in the plasma etching device 10, chemicals such as oxygen radicals or oxygen ions dissociated from $O_2$ gas by the plasma excitation using a microwave are bonded to S in COS, so that COS is dissociated into CO and SO. SO ions in SO obtained by the dissociation are attracted downward, i.e., toward the target object W, by the high frequency power applied to the high frequency electrode, thereby etching the top surface of the multilayer film, i.e., the top surface of the resist mask PRM, and the bottom surface defining the space formed in the multilayer film, i.e., the surface of the organic film which forms the bottom surface of the space. As a result, S and $CO_x$ are generated. S thus generated is bonded to oxygen ions and becomes $SO_x$. $CO_x$ and the $SO_x$ are exhausted as gases. Further, SO radicals generated by the dissociation of COS are adsorbed on the sidewall SW defining the space SP formed by the etching without being affected by the high frequency power applied to the high frequency electrode, so that the sidewall SW can be protected. In this manner, in accordance with the plasma etching device 10, the sidewall can be protected by SO radicals directly adsorbed thereon, unlike the conventional sidewall protection technique using compounds or etching by-products. Accordingly, the multilayer mask M can be formed while ensuring the sidewall SW having a highly vertical profile.

Further, SO radicals modify only the top surface of the organic film portion ODLM or that of the resist mask PRM which forms the sidewall of the multilayer mask M. In other words, a deep portion of the multilayer mask M is not modified by SO radicals, so that ashing of the multilayer mask M becomes relatively easier.

Figure 5:
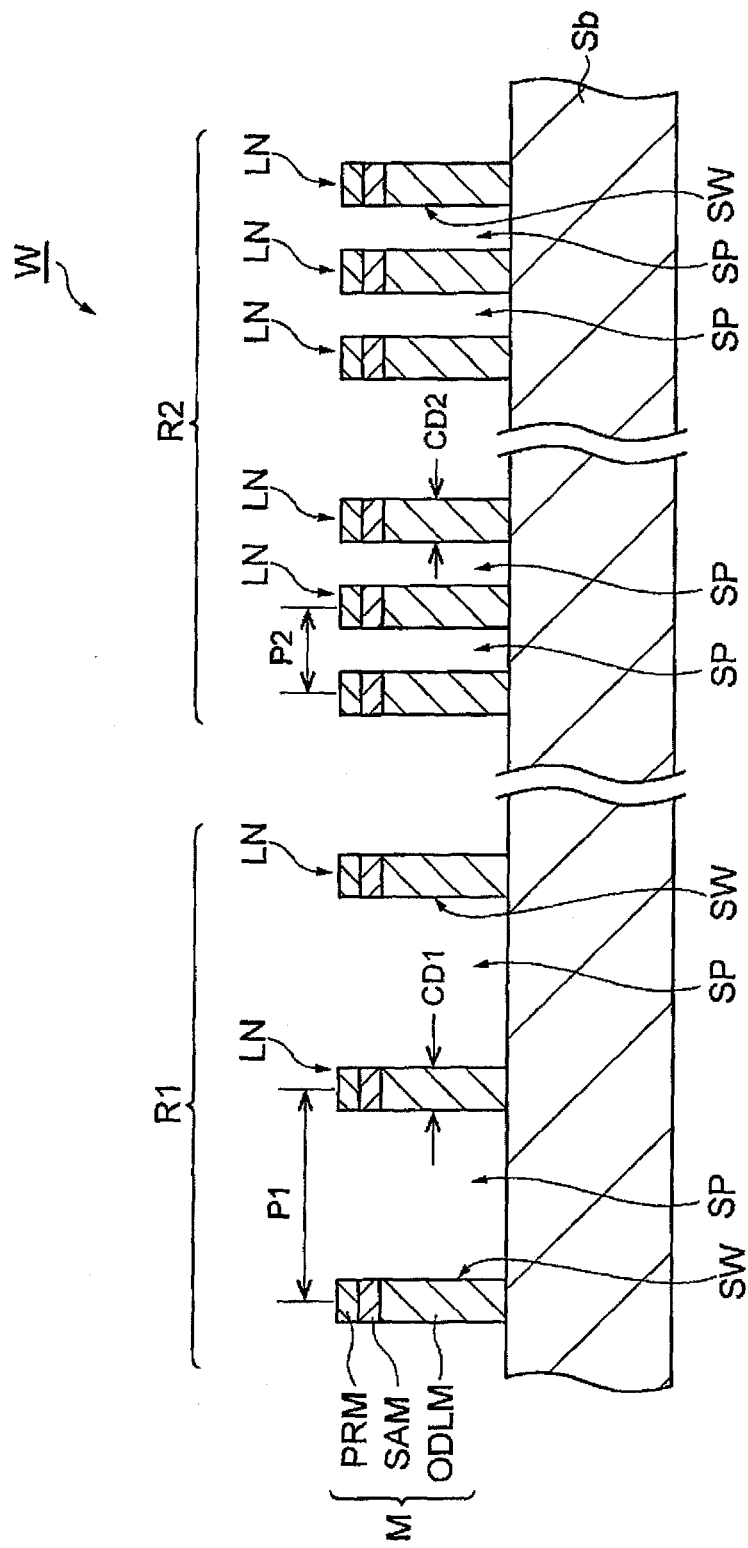
FIG. 5 is a cross sectional view showing a multilayer mask in accordance with another embodiment of the present invention.

The plasma etching device 10 can also form the multilayer mask M shown in FIG. 5. The multilayer mask M shown in FIG. 5 has a line-and-space pattern with a pitch P1 in a first region (i.e., sparse region) R1 and a line-and-space pattern with a pitch P2 smaller than the pitch P1 in a second region (i.e., dense region) R2.

When the organic film is etched to form the multilayer mask M shown in FIG. 5, $O_2$ gas from the gas source 82a, COS gas from the gas source 84a, and $N_2$ gas from the gas source 86a can be introduced, as the processing gas, into the processing chamber 12. If $N_2$ gas is contained in the processing gas, oxygen dissociated from the $O_2$ gas is bonded to nitrogen dissociated from $N_2$ gas. Accordingly, the amount of oxygen-based chemical species contributing to the etching of the organic film is decreased.

The amount of oxygen-based chemical species contributing to the etching can be spatially controlled by relatively adjusting a flow rate of $N_2$ gas with respect to a flow rate of $O_2$ gas which are supplied to each of the first and the second region R1 and R2. This enables separate control of CD values of the first and the second region R1 and R2. As a result, the difference in the CD values between the first region R1 and the second region R2 can be reduced. In the plasma etching device 10, the ratio of the $O_2$ gas flow rate and the $N_2$ gas flow rate can be controlled by applying control signals from the controller Cont to the mass flow controllers 82c and 86c.

$N_2$ gas may be introduced into the processing space S also in the case of etching the organic film to form the multilayer mask M having a pattern with a regular pitch shown in FIG. 4.

In the present embodiment, the pressure controller 56a may control a pressure in the processing space S to a range from 20 mTorr (2.6 Pa) to 100 mTorr (13.3 Pa) based on a pressure in the processing space S measured by the pressure sensor. As the pressure in the processing space S is increased within the above range, a pattern width of the multilayer mask M, i.e., a width of a line LN, over the entire the target object W can be reduced.

Figure 6:
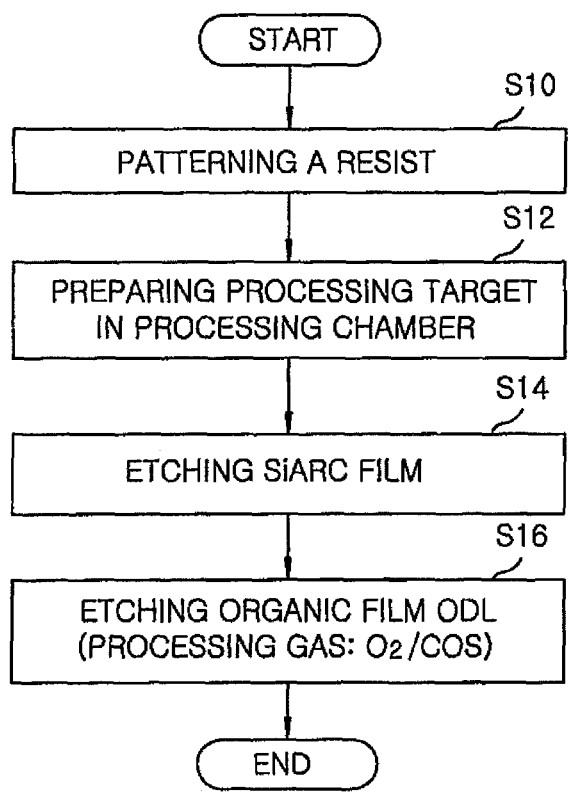
FIG. 6 is a flowchart of an etching method in accordance with an embodiment of the present invention.
Figure 7:
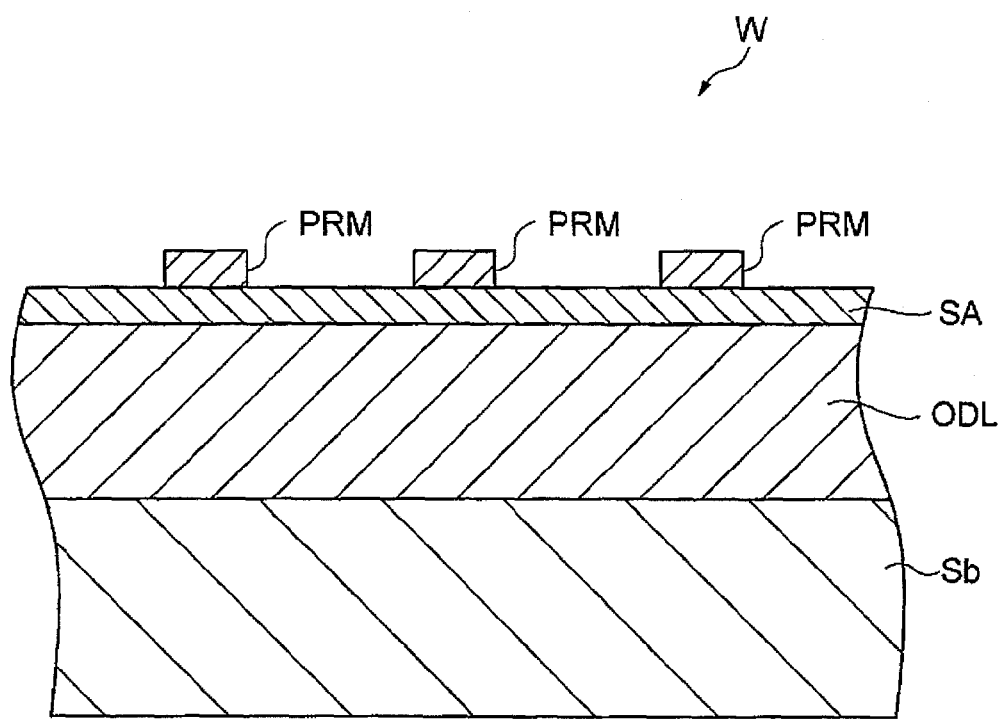
FIG. 7 is a cross sectional view showing products generated in a step 10 of FIG. 6.
Figure 8:
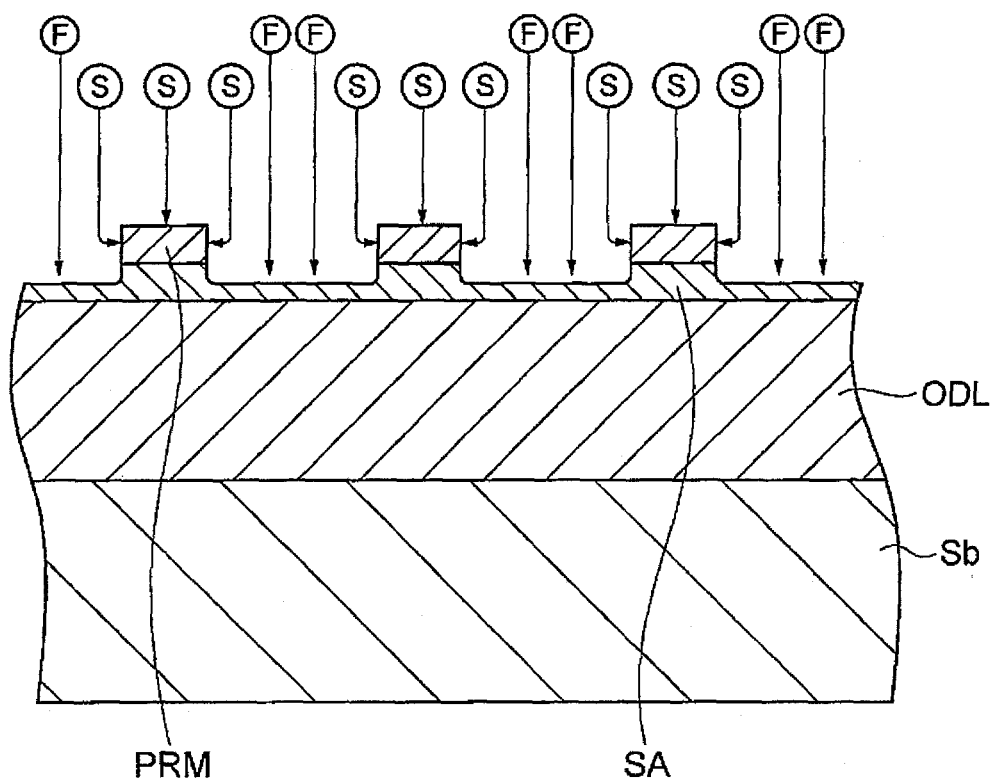
FIG. 8 is a cross sectional view for explaining principal of etching and sidewall protection in a step S14 of FIG. 6.
Figure 9:
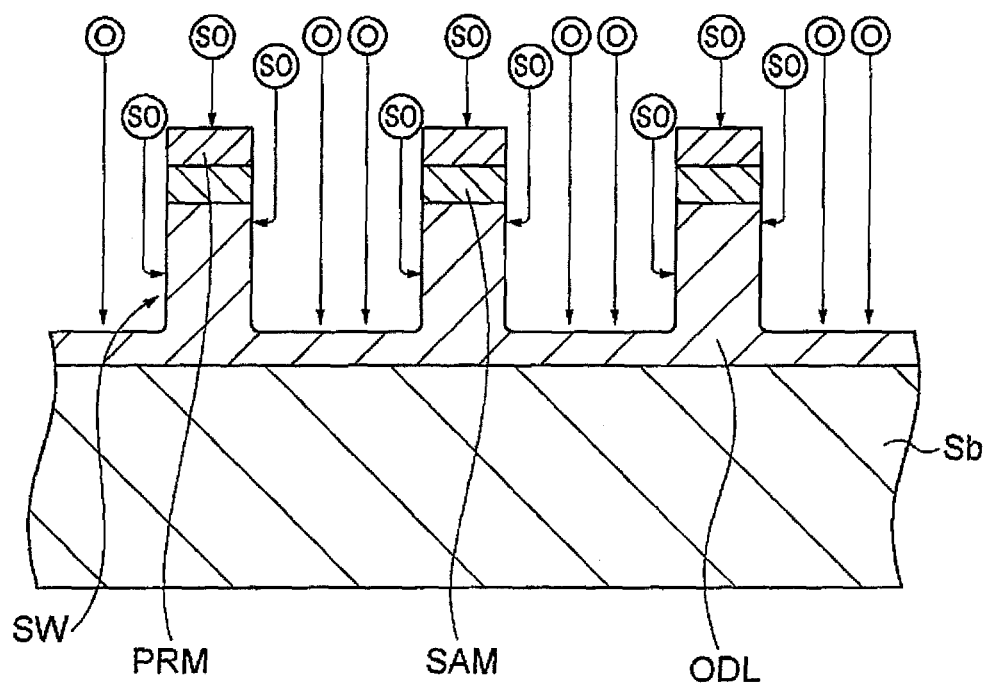
FIG. 9 is a cross sectional view for explaining principal of etching and sidewall protection in a step S16 of FIG. 6.

Hereinafter, an etching method that can be implemented by using the plasma etching device 10 will be described in detail with reference to FIGS. 6 to 9. FIG. 6 is a flowchart of the etching method in accordance with an embodiment of the present invention. FIG. 7 is a cross sectional view showing products generated in a step 10 of FIG. 6. FIG. 8 is a cross sectional view for explaining a principle of sidewall protection and etching in a step S14 of FIG. 6. FIG. 9 is a cross sectional view for explaining a principle of sidewall protection and etching in a step S16 of FIG. 6.

In the etching method of the present embodiment, first, in the step S10, a resist mask PRM is formed by patterning a resist film. The patterning of the resist film can be carried out by exposing the resist film by using a lithography device and developing the exposed resist film. As a result of the step S10, the target object W shown in FIG. 7 is obtained. In other words, the target object W including a substrate Sb, an organic film ODL formed on the substrate Sb, a SiARC film SA formed on the organic film ODL, and a resist mask PRM formed on the SiARC film SA as shown in FIG. 7 is obtained.

Next, in the step S12 of the etching method of the present embodiment, the target object W shown in FIG. 7 is prepared in the processing chamber 12. Specifically, the target object W is transferred onto the electrostatic chuck 20b by a transfer robot or the like.

Thereafter, in the step S14 of the etching method of the present embodiment, a SiARC film portion SAM of the multilayer mask M is formed by etching the SiARC film SA. In the step S14, gaseous mixture of $CF_4$ gas and COS gas is introduced, as the processing gas, into the processing chamber 12 and the microwave is introduced into the processing chamber 12. In the step S14, as shown in FIG. 8, fluorine is dissociated from $CF_4$ by the plasma excitation using a microwave, and the SiARC film is etched along the pattern of the resist mask PRM by fluorine-based chemical species (indicated by circled "F" in FIG. 8). Further, in the step S14, fluorine dissociated from $CF_4$ gas dissociates COS into CO and S. S (indicated by circled "S" in FIG. 8) is adsorbed on the surface of the resist mask PRM. In this manner, the resist mask PRM is protected. Since the SiARC film SA is etched while protecting the resist mask PRM by using S radicals, the decrease in the film thickness of the resist mask PRM is supressed.

In another embodiment, when the SiARC film SA is etched, $CH_2F_2$ gas may be contained, instead of COS, in the gaseous mixture.

Next, in the step S16 of the etching method of the present embodiment, an organic film portion ODLM of the multilayer mask M is formed by etching the organic film ODL. In the step S16, the gaseous mixture containing $O_2$ gas and COS gas is introduced, as the processing gas, into the processing chamber 12 and the microwave is introduced into the processing chamber 12. In the step S16, oxygen is dissociated from $O_2$ gas by the plasma excitation using a microwave and the organic film ODL is etched along the pattern of the resist mask PRM by oxygen-based chemical species (indicated by circled "O" in FIG. 9), as shown in FIG. 9. In the step S14, COS gas is dissociated into CO and SO by the oxygen-based chemical species and SO radicals (indicated by circled "SO" in FIG. 9) thus generated are adsorbed on the sidewall SW of the multilayer mask, i.e., the sidewall SW defining the space formed by the etching. The sidewall SW is formed by the resist mask PRM, the SiARC film portion SAM, and the side surface of the organic film ODL formed by the etching. In this manner, the organic film ODL is etched while protecting the sidewall SW by SO radicals adsorbed thereon. Accordingly, the organic film ODL can be etched while ensuring the sidewall having a profile of high verticality.

As described above, in the present embodiment, in the step S16, $N_2$ gas may be contained, in addition to $O_2$ gas and COS gas, in the gaseous mixture, and such a gaseous mixture may be introduced into the processing chamber 12. Nitrogen from $N_2$ gas contained in the gaseous mixture is bonded to oxygen from $O_2$ gas, thereby generating NO. Thus, the amount of oxygen-based chemical species contributing to the etching can be controlled by adding $N_2$ gas to the gaseous mixture. Accordingly, even in the case of forming the multilayer mask M having the first region R1, i.e., the sparse region, and the second region R2, i.e., the dense region, as shown in FIG. 5, the amount of oxygen-based chemical species contributing to the etching can be spatially controlled and, thus, the CD values in the first and the second region R1 and R2 can be individually controlled. As a result, the difference in the CD values between the first region R1 and the second region R2 can be reduced.

Further, as described above, in the present embodiment, a pressure in the processing space S is controlled to 20 mTorr to 100 mTorr in the step S16. As the pressure in the processing space S is increased within the above range, the pattern width of the multilayer mask M, i.e., the width of the line LN, over the entire target object W can be reduced.

Hereinafter, the present invention will be described in detail based on test examples and a comparative example. However, the present invention is not limited to the following test examples.

TEST EXAMPLES 1 AND 2

In the test examples 1 and 2, an organic film ODL of a target object W was etched by the plasma etching device 10, and an emitting spectrum in the processing space S during etching was monitored by an OES (Optical Emission Spectrometer). The etching conditions in the test examples 1 and 2 are described in Table 1. In Table 1, "MW power" indicates power of a microwave having a frequency of 2.45 GHz which is generated by the microwave generator 28; "RF power" indicates power of RF bias having a frequency of 13.65 MHz which is generated by the high frequency power supply 58; "pressure" indicates a pressure in the processing space S; "gas flow rates ($O_2$, COS, $N_2$)" indicate flow rates of $O_2$ gas, COS gas and $N_2$ gas; "flow rate ratio (center:periphery)" indicates a ratio of gas flow rates between the central introduction unit 22 and the peripheral inlet portion 24; "temperatures HT, HS, HCS, HES, chiller" indicate temperatures of heaters HT, HS, HCS, HES, and a chiller provided in the coolant channel 20g; and "processing time" indicates duration of processing.

TABLE 1

| | MW power (W) | RF power (W) | Pressure (mTorr) | Gas flow rate (sccm) $O_2$ | COS | $N_2$ | Flow rate ratio center: periphery | Temperature (°C.) HT | HS | HCS | HES | Chiller | Processing time (sec) |
|---|---|---|---|---|---|---|---|---|---|---|---|---|---|
| Test example 1 | 2000 | 0 | 20 | 75 | 30 | 900 | 5:95 | 80 | 80 | 15 | 30 | 10 | 30 |
| Test example 2 | 2000 | 150 | 20 | 75 | 30 | 900 | 5:95 | 80 | 80 | 15 | 30 | 10 | 30 |

Figure 10A:
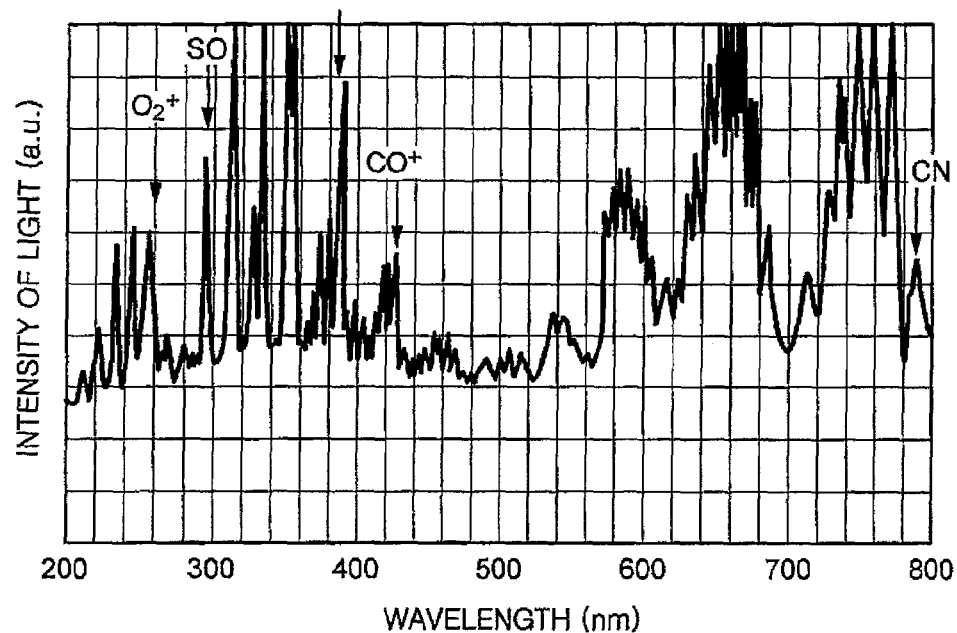
FIGS. 10A and 10B are graphs showing emission spectrums of a test example 1.
Figure 10B:
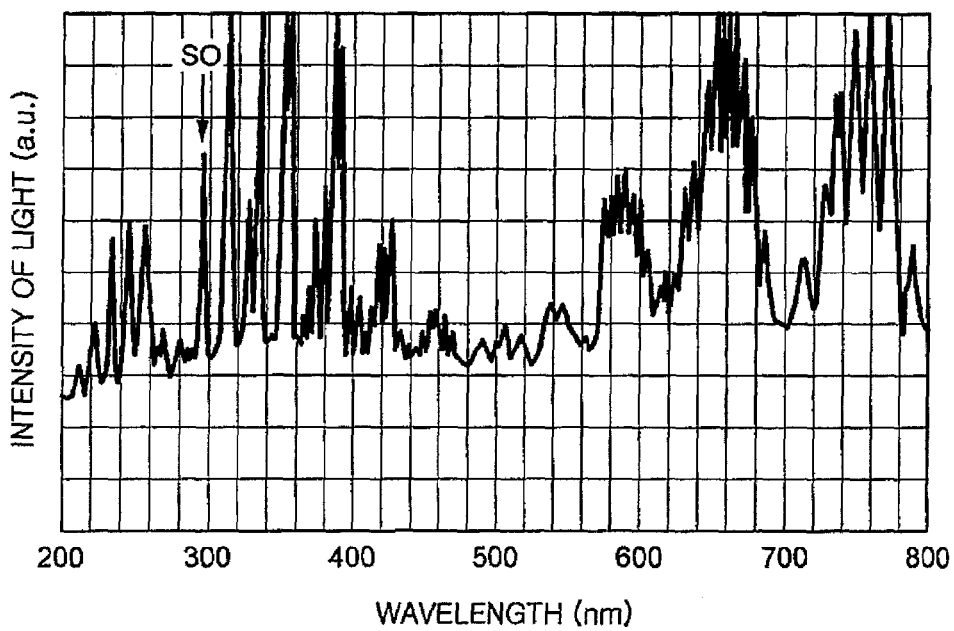

FIGS. 10A and 10B show emission spectra monitored in the test examples 1 and 2. A graph of FIG. 10A shows an emission spectrum in the test example 1, i.e., in the case of applying no RF bias. A graph of FIG. 10B shows an emission spectrum in the test example 1, i.e., in the case of applying the RF bias of 150 W. As can be seen from FIGS. 10A and 10B, in any of the test examples 1 and 2, i.e., regardless of application/non-application of the RF bias, SO is dominant as chemical species containing S dissociated from COS gas in the plasma etching device 10. From the above result, it is clear that the plasma etching device 10 can protect the sidewall by using SO radicals, i.e., without using etching by-products.

TEST EXAMPLE 3

In the test example 3, a multilayer mask having a line-and-space pattern with a regular pitch of 70 nm was obtained by etching a multilayer film including, a resist mask PRM made of an ArF resist film having a film thickness of 90 nm, a SiARC film SA having a film thickness of 35 nm, and an organic film ODL having a film thickness of 200 nm by the plasma etching device 10. The etching conditions for the SiARC film and those for the organic film in the test example 3 are shown in Table 2. Parameters in Table 2 are the same as those in Table 1. Further, "gas flow rates ($CF_4$, $CH_2F_2$)" indicate flow rates of $CF_4$ gas and $CH_2F_2$ gas.

TABLE 2

| | MW power (W) | RF power (W) | Pressure (mTorr) | Gas flow rate (sccm) | | | | | Flow rate ratio center: periphery | Temperature (° C.) | | | | | Processing time (sec) |
|---|---|---|---|---|---|---|---|---|---|---|---|---|---|---|---|
| | | | | $CF_4$ | $CH_2F_2$ | $O_2$ | COS | $N_2$ | | HT | HS | HCS | HES | Chiller | |
| SiARC film etching conditions | 2000 | 300 | 100 | 150 | 40 | — | — | — | 5:95 | 80 | 80 | 30 | 45 | 14 | 14 |
| Organic film etching conditions | 2000 | 150 | 20 | — | — | 75 | 30 | 900 | 5:95 | 80 | 80 | 15 | 30 | 10 | 30 |

An SEM image of the multilayer mask in the test example 3 was obtained and CD values (CDt, CDm, CDb shown in FIG. 4) at an upper, an intermediate and a bottom portion of a single line LN in the multilayer mask were measured by using the SEM image. The result thereof is shown in Table 3.

obtained. In the test examples 4 to 6, the amount of $N_2$ gas contained in the gaseous mixture used for etching the organic film ODL was varied. The etching conditions for the SiARC film and those for the organic film in the test examples 4 to 6 are shown in Table 4.

TABLE 4

| | | MW power (W) | RF power (W) | Pressure (mTorr) | Gas flow rate (sccm) | | | | | Flow rate ratio center: periphery | Temperature (° C.) | | | | | Processing time (sec) |
|---|---|---|---|---|---|---|---|---|---|---|---|---|---|---|---|---|
| | | | | | $CF_4$ | $CH_2F_2$ | $O_2$ | COS | $N_2$ | | HT | HS | HCS | HES | Chiller | |
| Test examples 4 to 6 | SiARC film etching conditions | 2000 | 300 | 100 | 150 | 40 | — | — | — | 5:95 | 80 | 80 | 30 | 45 | 14 | 14 |
| Test example 4 | Organic film etching conditions | 2000 | 150 | 20 | — | — | 75 | 30 | 400 | 5:95 | 80 | 80 | 15 | 30 | 10 | 75 |
| Test example 5 | Organic film etching conditions | 2000 | 150 | 20 | — | — | 75 | 30 | 600 | 5:95 | 80 | 80 | 15 | 30 | 10 | 75 |
| Test example 6 | Organic film etching conditions | 2000 | 150 | 20 | — | — | 75 | 30 | 900 | 5:95 | 80 | 80 | 15 | 30 | 10 | 75 |

TABLE 3

| CDt (nm) | CDm (nm) | CDb (nm) |
|---|---|---|
| 42.2 | 42.9 | 42.9 |

As clearly can be seen from Table 3, the difference in the CD values between the upper, the intermediate, and the bottom portion of the line LN of the multilayer mask is 0.7 nm. Therefore, it is clear that the sidewall having a profile of high verticality can be formed by performing etching using the plasma etching device 10.

TEST EXAMPLES 4 TO 6

In the test examples 4 to 6, a multilayer film including a resist mask PRM made of an ArF resist film having a film thickness of 90 nm, a SiARC film SA having a film thickness of 35 nm, and an organic film ODL having a film thickness of 200 nm was etched by the plasma etching device 10. Accordingly, a multilayer mask having a line-and-space pattern with a pitch P1 of 2 μm in a sparse region R1 and a line-and-space pattern with a pitch P2 of 70 nm in a dense region R2 was SEM images of the multilayer masks in the test examples 4 to 6 were obtained. In the respective multilayer masks of the test examples 4 to 6, a CD value (CD1 shown in FIG. 5) at an intermediate portion in a height direction of a single line LN in the sparse region R1 and a CD value (CD2 shown in FIG. 5) at an intermediate portion in a height direction of a single line LN in the dense region R2 were measured by using the SEM images. The result thereof is shown in Table 5. In Table 5, initial values of CD1 and CD2 indicate a CD value of the resist mask in the sparse region R1 and a CD value of the resist mask in the dense region R2, respectively, after the patterning of the resist film, i.e., before the etching of the SiARC film and the organic film.

TABLE 5

| | CD1 (nm) | CD2 (nm) | CD difference (nm) |
|---|---|---|---|
| Initial value | 77.8 | 47.5 | 30.3 |
| Test example 5 | 91.6 | 50.8 | 40.8 |
| Test example 6 | 87.0 | 50.1 | 36.9 |
| Test example 7 | 83.4 | 48.0 | 35.4 |

As clearly can be seen from Tables 4 and 5, the difference between the CD value (CD1) of the sparse region R1 and the CD value (CD2) of the dense region R2 can be reduced by increasing the flow rate of $N_2$ gas with respect to the flow rate of $O_2$ gas. Further, it was seen that the CD values in both of the sparse region R1 and the dense region R2 became close to initial CD values of the resist mask by increasing the flow rate of $N_2$ gas with respect to the flow rate of $O_2$ gas.

TEST EXAMPLES 7 TO 9

In the test examples 7 to 9, a multilayer mask having a line-and-space pattern with a regular pitch of 70 nm was obtained by etching a multilayer film including a resist mask PRM formed of an ArF resist film having a film thickness of 90 nm, a SiARC film SA having a film thickness of 35 nm, and an organic film ODL having a film thickness of 200 nm by using the plasma etching device 10. In the test examples 7 to 9, a pressure in the processing space S during the etching of the organic film ODL was varied. The etching conditions for the SiARC film and those for the organic film in the test examples 7 to 9 are shown in Table 6.

As clearly can be seen from Tables 6 and 7, even when the processing time was the same, the CD value was decreased in proportion to the increase of the pressure in the processing space S. Further, the CD values at the upper, the intermediate, and the bottom portion of the line LN were not greatly different even if the pressure in the processing space S was changed. Therefore, it is clear that even when the processing time is the same, the CD values of the multilayer mask M can be decreased over the entire target object W while suppressing effect on the verticality of the profile of the sidewall by increasing the pressure in the processing space S.

TEST EXAMPLES 10 AND 11

In the test examples 10 and 11, a multilayer mask having a line-and-space patter with a regular pitch of 70 nm was

TABLE 6

| | | MW power (W) | RF power (W) | Pressure (mTorr) | Gas flow rate (sccm) | | | | | Flow rate ratio center: periphery | Temperature (°C.) | | | | | Processing time (sec) |
|---|---|---|---|---|---|---|---|---|---|---|---|---|---|---|---|---|
| | | | | | $CF_4$ | $CH_2F_2$ | $O_2$ | COS | $N_2$ | | HT | HS | HCS | HES | Chiller | |
| Test examples 7 to 9 | SiARC film etching conditions | 2000 | 300 | 100 | 150 | 40 | — | — | — | 5:95 | 80 | 80 | 30 | 45 | 14 | 14 |
| Test example 7 | Organic film etching conditions | 2000 | 150 | 20 | — | — | 75 | 30 | 900 | 5:95 | 80 | 80 | 15 | 30 | 10 | 30 |
| Test example 8 | Organic film etching conditions | 2000 | 150 | 50 | — | — | 75 | 30 | 900 | 5:95 | 80 | 80 | 15 | 30 | 10 | 30 |
| Test example 9 | Organic film etching conditions | 2000 | 150 | 100 | | | 75 | 30 | 900 | 5:95 | 80 | 80 | 15 | 30 | 10 | 30 |

SEM images of multilayer masks in the test examples 7 to 9 were obtained. In the respective multilayer masks of the test examples 7 to 9, CD values (CDt, CDm and CDb in FIG. 4) at an upper, an intermediate, and a bottom portion of a single line LN were measured by using the SEM images. The result thereof is shown in Table 7.

TABLE 7

| | CDt (nm) | CDm (nm) | CDb (nm) |
|---|---|---|---|
| Test example 7 | 42.2 | 42.9 | 42.9 |
| Test example 8 | 35.6 | 33.6 | 33.6 |
| Test example 9 | 32.3 | 29.0 | 27.7 | obtained by etching a multilayer film including a resist mask PRM made of an ArF resist film having a film thickness of 90 nm, a SiARC film SA having a film thickness of 35 nm, and an organic film ODL having a film thickness of 200 nm by using the plasma etching device 10. In the test examples 10 and 11, a processing gas used for etching the SiARC film SA was varied. The etching conditions for the SiARC film and those for the organic film in the test examples 10 and 11 are shown in Table 8.

TABLE 8

| | | MW power (W) | RF power (W) | Pressure (mTorr) | Gas flow rate (sccm) | | | | | Flow rate ratio center: periphery | Temperature (°C.) | | | | | Processing time (sec) |
|---|---|---|---|---|---|---|---|---|---|---|---|---|---|---|---|---|
| | | | | | $CF_4$ | $CH_2F_2$ | $O_2$ | COS | $N_2$ | | HT | HS | HCS | HES | Chiller | |
| Test example 10 | SiARC film etching conditions | 2000 | 300 | 100 | 150 | 40 | — | — | — | 5:95 | 80 | 80 | 30 | 45 | 14 | 14 |

TABLE 8-continued

| | | MW power (W) | RF power (W) | Pressure (mTorr) | Gas flow rate (sccm) | | | | | Flow rate ratio center: periphery | Temperature (°C.) | | | | | Processing time (sec) |
|---|---|---|---|---|---|---|---|---|---|---|---|---|---|---|---|---|
| | | | | | $CF_4$ | $CH_2F_2$ | $O_2$ | COS | $N_2$ | | HT | HS | HCS | HES | Chiller | |
| Test example 11 | SiARC film etching conditions | 2000 | 300 | 100 | 150 | — | — | 40 | — | 5:95 | 80 | 80 | 30 | 45 | 14 | 14 |
| Test examples 10-11 | Organic film etching conditions | 2000 | 150 | 20 | — | — | 75 | 30 | 900 | 5:95 | 80 | 80 | 15 | 30 | 10 | 30 |

SEM images of multilayer masks in the test examples 10 and 11 were obtained. In the respective multilayer masks of the test examples 10 and 11, a remaining film thickness of the resist mask PRM, a CD value at a bottom portion of the SiARC film portion SAM, and a CD value at a bottom portion of the organic film portion ODLM in a single line LN were measured by using the SEM images. The result thereof is shown in Table 9.

TABLE 9

| | Remaining film thickness of SiARC film (nm) | CD value at bottom portion of SiARC film (nm) | CD value at bottom portion of organic film (nm) |
|---|---|---|---|
| Test example 10 | 7.3 | 56.7 | 48.0 |
| Test example 11 | 22.2 | 65.3 | 64.0 |

As clearly can be seen from Tables 8 and 9, the remaining film thickness of the SiARC film was greater in the test example 11 in which the SiARC film was etched by using a processing gas containing $CF_4$ gas and COS gas than in the test example 10 in which the SiARC film was etched by using a processing gas containing $CF_4$ gas and $CH_2F_2$ gas. Further, the difference in the CD values between the bottom portion of the SiARC film and the bottom portion of the organic film was smaller in the test example 11 than in the test example 10. In other words, it is more preferable to add COS gas to the etching gas for the SiARC film.

DESCRIPTION OF REFERENCE NUMERALS

10 . . . plasma etching device
12 . . . processing chamber
14 . . . antenna
16 . . . coaxial waveguide
18 . . . dielectric window
20 . . . stage
20a . . . holder (high frequency electrode)
22 . . . central inlet portion
24 . . . peripheral inlet portion
28 . . . microwave generator
38 . . . dielectric plate
40 . . . slot plate
56a . . . pressure controller
56b . . . gas exhaust unit
58 . . . high frequency power supply
Cont . . . controller
FS . . . flow splitter
GS . . . gas supply unit
M . . . multilayer mask
ODL . . . organic film
PRM . . . resist mask
R1 . . . first region (sparse region)
R2 . . . second region (dense region)
SA . . . Si anti-reflection coating (ARC) film
SW . . . sidewall

What is claimed is:

1. A method for etching an organic film, comprising:
preparing in a processing chamber a target object having an organic film; and
etching the organic film to provide a patterned organic film by supplying a processing gas including COS gas and $O_2$ gas into the processing chamber and supplying a microwave for plasma excitation into the processing chamber, wherein SO radicals are dissociated from the COS gas and adsorbed on a sidewall of the patterned organic film formed by said etching.

2. The method of claim 1, wherein the target object includes a substrate and a multilayer film formed on the substrate, the multilayer film having a patterned resist film and the organic film formed between the patterned resist film and the substrate.

3. The method of claim 2, wherein in the etching the organic film, the processing gas further includes $N_2$ gas.

4. The method of claim 2, wherein in the etching the organic film, a pressure in the processing chamber is controlled to a range from 20 mTorr to 100 mTorr.

5. The method of claim 2, wherein the multilayer film has a Si anti-reflection coating film provided between the patterned resist film and the organic film, and
the method further comprises, before the etching the organic film, etching the Si anti-reflection coating film by supplying an etching gas including a fluorocarbon-based gas and COS gas into the processing chamber and supplying a microwave into the processing chamber, wherein S radicals are dissociated from the COS gas included in the etching gas and are adsorbed on a surface of the patterned resist film.

6. A plasma etching device comprising:
a processing chamber;
a gas supply unit configured to supply a processing gas including COS gas and $O_2$ gas into the processing chamber;
a microwave generating unit; and
an antenna, connected to the microwave generating unit, configured to supply a microwave for plasma excitation into the processing chamber so that SO radicals are dissociated from the COS gas.

7. The plasma etching device of claim 6, wherein processing gas further includes $N_2$ gas.

8. The plasma etching device of claim 7, wherein the gas supply unit includes a unit configured to control a flow rate ratio of the $N_2$ gas and the $O_2$ gas.

9. The plasma etching device of claim 6, further comprising a pressure controller configured to control a pressure in the processing chamber.

10. The plasma etching device of claim 9, wherein the pressure controller controls the pressure in the processing chamber to a range from 20 mTorr to 100 mTorr.

11. The plasma etching device of claim 6, wherein the gas supply unit further configured to supply another processing gas including a fluorocarbon-based gas and COS gas.

* * * * *